(12) United States Patent
De Lorenzo et al.

(10) Patent No.: US 6,891,724 B2
(45) Date of Patent: May 10, 2005

(54) INCREASING THERMAL CONDUCTIVITY OF THERMAL INTERFACE USING CARBON NANOTUBES AND CVD

(75) Inventors: David S. De Lorenzo, Olympia, WA (US); Stephen W. Montgomery, Federal Way, WA (US); Robert J. Fite, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 10/170,313

(22) Filed: Jun. 12, 2002

(65) Prior Publication Data

US 2003/0231471 A1 Dec. 18, 2003

(51) Int. Cl.⁷ .............................................. H05K 7/20
(52) U.S. Cl. ...................... 361/704; 165/80.2; 165/185; 174/16.3; 361/707; 361/708; 361/718; 361/719; 361/722; 428/216; 428/408
(58) Field of Search ................................ 165/80.2, 80.3, 165/185; 174/16.3; 257/706–707, 712–713; 361/704–710, 717–722, 720; 428/212, 216, 248, 401

(56) References Cited

U.S. PATENT DOCUMENTS

| | | | |
|---|---|---|---|
| 5,316,080 A | 5/1994 | Banks et al. ................. | 165/185 |
| 5,604,037 A | 2/1997 | Ting et al. ................... | 428/408 |
| 5,825,624 A * | 10/1998 | Arnold et al. ............... | 361/708 |
| 5,837,081 A | 11/1998 | Ting et al. ................. | 156/89.26 |
| 5,965,267 A * | 10/1999 | Nolan et al. ................. | 428/408 |
| 6,407,922 B1 * | 6/2002 | Eckblad et al. ............. | 361/704 |
| 6,504,292 B1 | 1/2003 | Choi et al. ................... | 313/310 |
| 6,651,736 B2 | 11/2003 | Chiu et al. ................... | 165/185 |
| 2002/0105071 A1 | 8/2002 | Mahajan et al. ............. | 257/720 |
| 2003/0135971 A1 | 7/2003 | Liberman et al. .......... | 29/419.1 |
| 2003/0179559 A1 | 9/2003 | Engelhardt et al. ......... | 361/780 |
| 2004/0150100 A1 | 8/2004 | Dubin et al. ................. | 257/720 |

FOREIGN PATENT DOCUMENTS

| | | | | |
|---|---|---|---|---|
| EP | 0538798 | 4/1993 | ......... | H01L/23/373 |
| EP | 0689244 | 12/1995 | ......... | H01L/23/373 |

OTHER PUBLICATIONS

US 2003/0117770 Montgomery et al "Carbon Nanotube Thermal Interface Structures", Jun. 2003.*
"High Conduction Thermal Interface Material", *IBM Technical Disclosure Bulletin*, 36 (10), IBM Corp., NY, US, (1993), 581–583.

* cited by examiner

Primary Examiner—Gregory D. Thompson
(74) Attorney, Agent, or Firm—Schwegman, Lundberg, Woessner & Kluth, P.A.

(57) ABSTRACT

The invention relates to a structure of and a process of forming an integrated circuit package that utilizes a thermal interface material layer having an aligned array of carbon nanotubes affixed to a surface of the layer. The thermal interface material is diamond deposited by chemical vapor deposition. The carbon nanotubes are formed by a plasma discharge process on the surface of the CVDD and also may be formed on the surface of the die.

23 Claims, 3 Drawing Sheets

INCREASING THERMAL CONDUCTIVITY OF THERMAL INTERFACE USING CARBON NANOTUBES AND CVD

An integrated circuit package provides increased thermal conductivity to a thermal interface between a circuit die and a thermal management solution such as a heat spreader or a heat sink by forming a chemical vapor deposited diamond surface on the thermal management solution and growing an array of carbon nanotubes on the surface of the CVDD layer or the circuit die.

BRIEF DESCRIPTION OF THE DRAWINGS

In order that the manner in which the embodiments of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention relates to a structure and a process of forming an integrated circuit package that utilizes a thermal interface material layer having an aligned array of carbon nanotubes projecting from a surface thereof.

In order to cool electronic packages such as electronic dies, a bare silicon die is covered with an integrated heat spreader which is formed from a thermally conductive material such as copper and serves to laterally distribute the thermal load provided by hot spots on the die corresponding, for example, to the areas of highest transistor activity.

Figure 1:
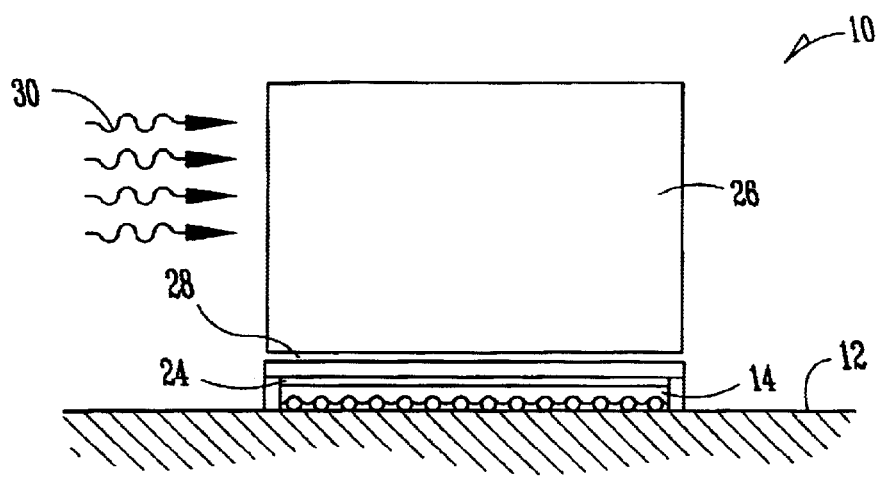
FIG. 1 is an elevational cross-section of a prior art stack-up schematic of a cooling arrangement for an integrated circuit package.

In FIG. 1, there is shown an integrated circuit package 10 which has an interposer or substrate 12 on which a die 14 is located adjacent the substrate 12 and thermally coupled thereto through solder balls 16 which are bonded to a surface of die 14 which adjacent to substrate 12. The space between adjacent solder balls 16 and between the surface of die 14 and substrate 12 is generally filled with a thermally conductive gel 18. The combination of the thermal conductivity of solder balls 16 and thermally conductive gel 18 provides a cooling path for a portion of the heat generated by die 14.

Figure 2:
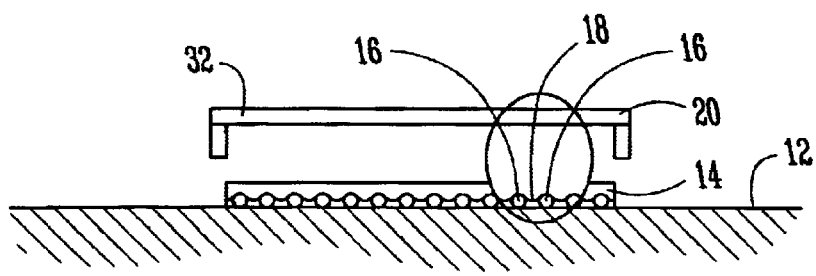
FIG. 2 is an elevational cross-section of a CVDD enhanced prior art stack-up.

As shown in FIGS. 1 and 2, a copper integrated heat spreader 20 is positioned adjacent to a further surface of die 14 which is opposite to the surface of die 14 which is adjacent to substrate 12. An inner surface 22 of heat spreader 20 is, in prior art packages such as the one shown in FIGS. 1 and 2, coupled to the surface of die 14 by a first thermal interface material layer 24 which is a thermally conductive material such as thermal grease or some similar material. Finally, the heat spreader 20 is in thermal contact with a copper heat sink 26 through a second thermal interface 28. Ambient air 30 flows across heat sink 26 to cool it.

Figure 3:
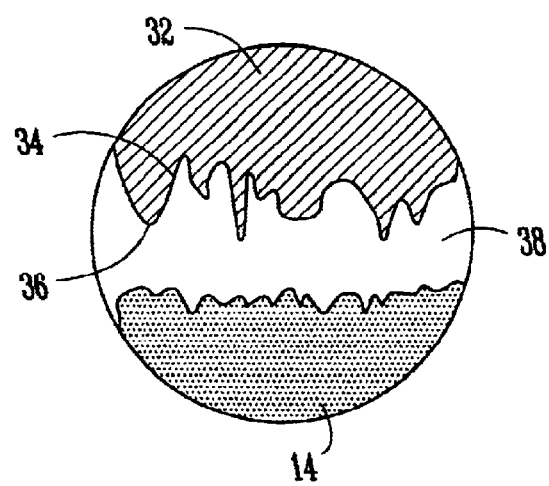
FIG. 3 is a detail of the elevational cross-section of a CVDD enhanced prior art stack-up depicted in FIG. 2 showing thermal interface material positioned between the CVDD layer and the die.

In the prior art it has also been known to provide a chemical vapor deposited diamond (CVDD) layer 32 between the die and the integrated spreader 20 to improve the lateral thermal conductivity of either the spreader 20 or the silicon die 14. CVDD layer 32 is illustrated in FIGS. 2 and 3 applied to the inner surface 22 of integrated heat spreader 20.

The thermal conductivity of the copper of the integrated heat spreader is about 395 W/mK while that of the silicon die is about 100 W/mK. The thermal conductivity of a CVDD a layer is expected to exceed 1000 W/mK. It has been found through simulations that CVDD layers having a thickness of about 450 microns can provide thermal benefits, measured as a decrease in the total junction-to-ambient thermal resistance, are approximately 10% of total for CVDD layers applied to the integrated heat spreader, 20% for the CVDD layer applied to the die and approximately 30% for combined CVDD layers on both the die and the integrated heat spreader.

One of the difficulties present with the use of CVDD layers applied to the die and the heat spreader are the roughness that is inherent with the unpolished deposited diamond surface 34 which is characterized by asperities 36 or projections that have sizes measured in microns. Although it may be possible to reduce the roughness somewhat by performing a polishing operation after the CVD process, such a polishing operation is expected to be a major contributor to the cost of manufacture of the product, particularly as the cost of the CVDD process itself decreases. Unfortunately, it also appears to be true that the roughness of the CVDD layer increases with increasing thickness of the CVDD layer despite the fact that increasing the thickness of the CVDD layer increases the thermal effectiveness of the layers. In the prior art, accommodation of the uneven surface of the die 14 or the inner surface 22 of the integrated heat spreader 20 as well as the lack of smoothness of the CVDD layer, whether it is applied to the die or to the integral heat spreader; a void filling thermal interface material 38 is inserted between the two.

Addition of aligned nanotubes to the thermal interface, whether the nanotubes are single wall or double wall, increases the thermal conductivity between the die and integral heat spreader while allowing the elimination of the polishing step from the CVDD process. Described below are embodiments of thermal solutions based upon the addition of nanotubes to the thermal interface between the die and the integrated heat spreader.

Figure 4:
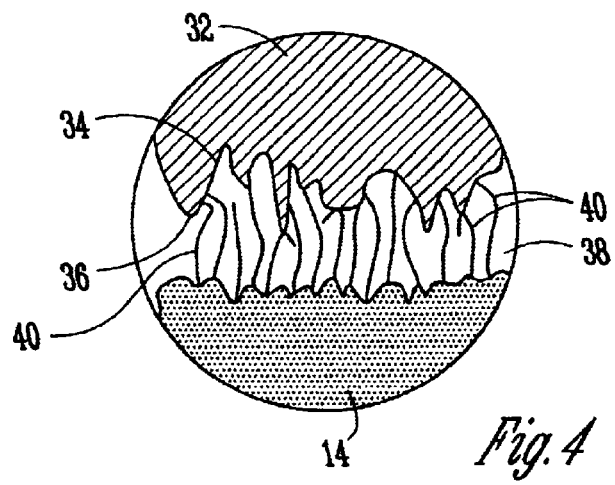
FIG. 4 is a detail of an elevational cross-section of an embodiment of the invention wherein a CVDD enhanced stack-up utilizes nanotubes grown on the die surface.

FIG. 4 shows an embodiment of the invention where the single or double wall carbon nanotubes 40 are grown on die 14 by a plasma discharge deposition process available in the art. Once the nanotubes 40 are grown on the surface of die 14, one end of nanotubes in the array is firmly affixed to the die 14. In this embodiment, the thermal conductivity of the nanotubes 40 is in a range of about 1000 to 6000 W/m-K as compared to the conductivity of the typical thermal grease thermal interface material of about 1–7 W/m-K. In the embodiment shown, the length of the nanotubes would typically be about 100 microns or less so that the thermal resistance of the layer would be negligible. The growing of the nanotubes 40 on the surface of die 14 fills the surface roughness valleys to provide a nearly uniform layer for the interface. A limited crush of the nanotubes 40 allows for an excellent thermal connection between the surface of die 14 and the CVDD coating 32 on inner surface 22 of heat spreader 20. In one embodiment a thermal grease may be applied to the array of nanotubes 40. In another embodiment, thermal grease is not used. In another embodiment, CVDD coating 32 may be formed on the surface of a heat sink 26 instead of a spreader 20.

Figure 5:
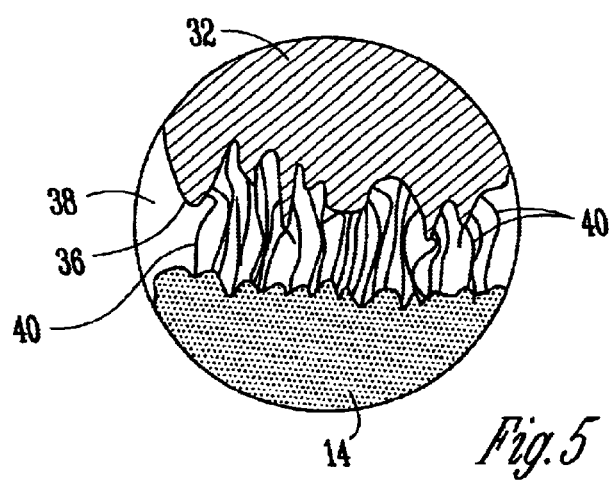
FIG. 5 is a detail of an elevational cross-section of a CVDD enhanced stack-up which shows nanotubes grown on the die surface and the CVDD layer.

FIG. 5 illustrates a further embodiment of the invention in which a structure has nanotubes 40 which are grown from both the CVDD surface of heat spreader 20 and the surface of die 14 using a plasma discharge method. In this embodiment the nanotubes 40 grown from and affixed to the opposed surfaces intermesh as the surfaces are mated to provide a good thermal interface, even without the use of thermal grease 38. In a further embodiment thermal grease 38 can be used in combination with the carbon nanotubes 40.

Figure 6:
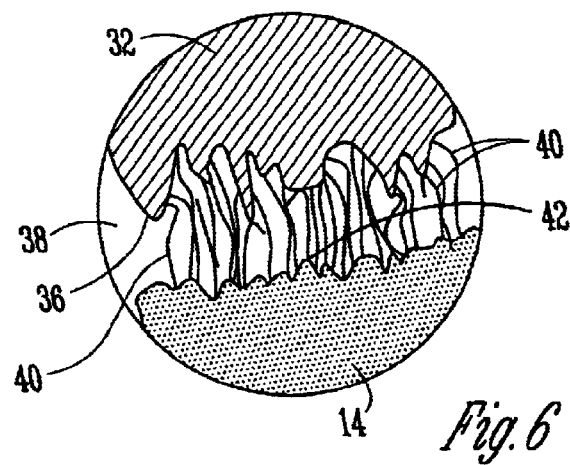
FIG. 6 is a detail of an elevational cross section of a CVDD enhanced stack-up which shows nanotubes grown on the CVDD layer of the integrated heat spreader.

FIG. 6 shows an embodiment of the invention where single or double wall carbon nanotubes 40 are grown on and affixed to the CVDD layer 32 of the integrated heat spreader 20 using a plasma discharge process. Again, the grown nanotubes 40 fill in the surface roughness valleys and asperities 36 and compensate for them. The projecting nanotubes 40 are subject to limited crushing of the nanotubes 40 into the peak roughness features 42 of the die 14. Again, in one embodiment, no grease 38 is necessary to form the thermal interface. In a further embodiment, thermal grease 38 is provided in combination with the nanotubes 40.

Figure 7:
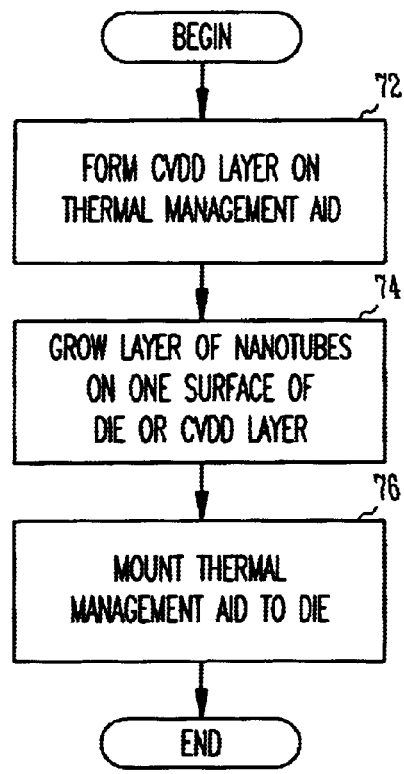
FIG. 7 is a process flow diagram of a process for coupling a circuit die to a thermal management aid.

FIG. 7 is a flow chart of an embodiment of the inventive process for enhancing heat flow from a circuit die to a thermal management aid such as a heat spreader or a heat sink. The first stage 72 of the process is forming a CVDD layer on a surface of thermal management aid. After the CVDD layer is formed, a further stage 74 an array of substantially aligned nanotubes is grown on one surface of the circuit die or on the CVDD layer on the thermal management aid. In stage 76 the thermal management aid is mounted to the die with the layer of nanotubes thermally coupling the surface of the circuit die to the CVDD layer of the thermal management aid.

Figure 8:
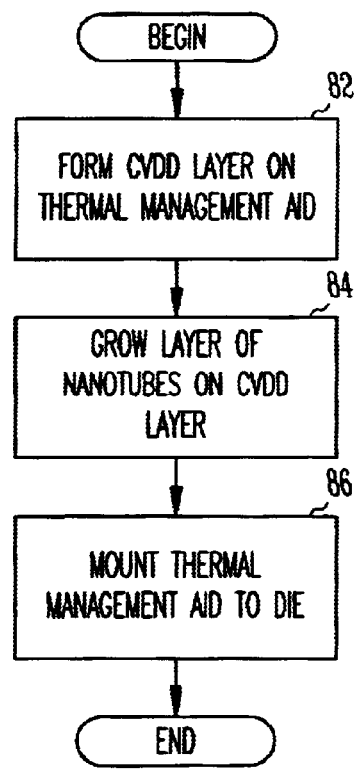
FIG. 8 is a process flow diagram of another process for coupling a circuit die to a thermal management aid.

FIG. 8 is a flow diagram of another embodiment of the inventive process for thermally coupling a circuit die to a thermal management aid such as a heat spreader or a heat sink. In an initial stage 82 a CVDD layer is formed on the thermal management aid. In stage 84 a layer of nanotubes is grown on the CVDD layer. In stage 86 the thermal management aid is mounted to the die with the layer of nanotubes thermally coupling the surface of the die to the CVDD layer of the thermal management aid.

It will be readily understood to those skilled in the art that various changes in the details, material, and arrangements of the parts and method stages which have been described and illustrated in order to explain the nature of this invention may be made without departing from the principles and scope of the invention as expressed in the subjoined claims.

What is claimed is:

1. Apparatus for cooling a circuit die, comprising:
   a thermal management aid having a CVDD surface; and
   an array of substantially aligned carbon nanotubes coupling a surface of the circuit die to the CVDD surface of the thermal management aid, the array of nanotubes affixed to one of either the surface of the die or the CVDD surface of the thermal management aid.

2. The apparatus of claim 1 wherein the carbon nanotubes of the array of carbon nanotubes are primarily affixed to the CVDD layer of the thermal management aid.

3. The apparatus of claim 1 wherein the carbon nanotubes of the array of carbon nanotubes are primarily affixed to the surface of the circuit die.

4. The apparatus of claim 1 wherein the carbon nanotubes of the array of carbon nanotubes are affixed to both the surface of the circuit die and the CVDD surface of the thermal management aid.

5. The apparatus of claim 1 wherein the thermal management aid is an integrated heat spreader.

6. The apparatus of claim 1 wherein the thermal management aid is a heat sink.

7. The apparatus of claim 1 wherein the array of substantially aligned carbon nanotubes also comprises thermal interface material.

8. The apparatus of claim 7 wherein the thermal interface material comprises a thermally conductive grease.

9. Apparatus for cooling a circuit die, comprising:
   a thermal management aid having a CVDD surface; and
   an array of substantially aligned carbon nanotubes coupling a surface of the circuit die to the CVDD surface of the thermal management aid, the array of nanotubes affixed to the surface of the die.

10. The apparatus of claim 9 wherein the array is also affixed to the CVDD surface.

11. The apparatus of claim 9 wherein the array also comprises thermally conductive grease.

12. Apparatus for cooling a circuit die, comprising:
    a thermal management aid having a CVDD surface; and
    an array of substantially aligned carbon nanotubes coupling a surface of the circuit die to the CVDD surface of the thermal management aid, the array of nanotubes affixed to the CVDD surface of the thermal management aid.

13. The apparatus of claim 12 wherein the apparatus also comprises a thermally conductive grease.

14. The apparatus of claim 12 wherein the array is also affixed to the die.

15. An integrated circuit package, comprising:
    a substrate;
    a circuit die mounted on the substrate
    a heat sink;
    a heat spreader thermally coupled to the heat sink and having a having a CVDD surface; and
    an array of substantially aligned carbon nanotubes coupling a surface of the circuit die to the CVDD surface of the heat spreader, the array of nanotubes affixed to one of either the surface of the circuit die or the CVDD surface of the thermal spreader.

16. The integrated circuit package of claim 15 wherein the array affixed to both the surface of the circuit die and the CVDD surface of the heat spreader.

17. The integrated circuit package of claim 15 wherein the array also comprises thermal grease.

18. A process for enhancing heat transfer from a circuit die to a thermal management aid, comprising:

forming a CVDD layer on a thermal management aid;
growing an array of nanotubes on one of a surface of the circuit die or the CVDD layer; and
mounting the thermal management aid to the circuit die with the layer of aligned nanotubes thermally coupling the surface of the circuit die to the CVDD layer of the thermal management aid.

19. The process according to claim 18, wherein the growing of a layer of nanotubes comprises forming the nanotubes on a surface of the die by a plasma-discharge process.

20. The process according to claim 18, wherein the growing of a layer of nanotubes comprises forming the nanotubes on the CVDD layer by a plasma-discharge process.

21. A process for thermally coupling a circuit die to a thermal management aid comprising:
forming a CVDD layer on a thermal management aid;
growing a layer of nanotubes on the CVDD layer; and
mounting the thermal management aid to the die with the layer of nanotubes thermally coupling the surface of the die to the CVDD layer of the thermal management aid.

22. The process according to claim 21, wherein the growing operation also comprises adding thermal interface material to the layer of nanotubes.

23. The process according to claim 21, also comprising growing a layer of nanotubes on the surface of the die and the mounting of the thermal management layer to the die also comprises intermeshing the layers of nanotubes.

* * * * *

UNITED STATES PATENT AND TRADEMARK OFFICE
CERTIFICATE OF CORRECTION

PATENT NO. : 6,891,724 B2
DATED : May 10, 2005
INVENTOR(S) : De Lorenzo et al.

It is certified that error appears in the above-identified patent and that said Letters Patent is hereby corrected as shown below:

Title page,
Item [56], References Cited, OTHER PUBLICATIONS,
"US 2003/0117770" reference, after "2003" insert -- ,361/687 --.

Column 4,
Line 55, delete "having a" before "CVDD".

Signed and Sealed this

Twenty-sixth Day of July, 2005

JON W. DUDAS
*Director of the United States Patent and Trademark Office*